United States Patent

Nagai

[11] Patent Number: 5,892,785
[45] Date of Patent: Apr. 6, 1999

[54] SEMICONDUCTOR LASER

[75] Inventor: Yutaka Nagai, Tokyo, Japan

[73] Assignee: Mitsubishi Denki Kabusiki Kaisha, Tokyo, Japan

[21] Appl. No.: 967,105

[22] Filed: Nov. 10, 1997

[30] Foreign Application Priority Data

Jul. 16, 1997 [JP] Japan .................................. 9-191232

[51] Int. Cl.$^6$ ...................................................... H01S 3/19
[52] U.S. Cl. ................................ 372/46; 372/43; 372/39; 372/44; 257/192
[58] Field of Search ................................ 372/46, 43, 45, 372/39, 44; 437/129; 257/192

[56] References Cited

U.S. PATENT DOCUMENTS 5,309,465  5/1994  Antreasyan et al. ...................... 372/43
5,478,775  12/1995  Fujii ........................................ 437/129
5,550,393  8/1996  Nishimura ............................... 257/192

*Primary Examiner*—Rodney Bovernick
*Assistant Examiner*—Sung T. Kim
*Attorney, Agent, or Firm*—Leydig, Voit & Mayer

[57] ABSTRACT

A semiconductor laser includes a lower cladding layer, an active layer, a first upper cladding layer, an etch-stopping layer, a second upper cladding layer, and a contact layer successively laminated on a substrate, a ridge waveguide formed by selectively etching the second upper cladding layer and the contact layer with the use of a stripe-like insulating film as a mask to form a ridge, an AlAs oxide layer on the substrate and a second electrode on the substrate. Incorrect positioning does not occur between the ridge waveguide and a first electrode, reliability is improved, and the distribution of effective refractive index transverse to the resonation of the laser is reduced. A detailed method of fabricating this semiconductor laser is also provided.

4 Claims, 6 Drawing Sheets

SEMICONDUCTOR LASER

FIELD OF THE INVENTION

The present invention relates to a semiconductor laser and a method of fabricating the semiconductor laser, and, more particularly, to a semiconductor laser including a ridge waveguide and a method of fabricating the semiconductor laser.

BACKGROUND OF THE INVENTION

FIG. 3 illustrates a cross-sectional view of a conventional semiconductor laser including a ridge waveguide (hereinafter) referred to as a ridge type semiconductor laser), taken parallel to facets of the laser resonator. In the figure, reference numeral 1 designates an n-GaAs substrate. An n-$Al_{0.3}Ga_{0.7}As$ lower cladding layer 2, a quantum well active layer 3, ap-$Al_{0.3}Ga_{0.7}As$ first upper cladding layer 4, a p-$Al_{0.7}Ga_{0.3}As$ etch-stopping layer 5, a p-$Al_{0.3}Ga_{0.7}As$ second upper cladding layer 6, and a p-GaAs contact layer 7 are disposed in this order on the substrate 1. A ridge waveguide 9 has a ridge structure extending like a stripe. A p side electrode 12 and an n side electrode 13 are disposed on top and bottom of the laser, respectively. An insulating film for current confinement 14 is disposed on the ridge waveguide 9 and the etch-stopping layer 5, having an opening 15 forming a stripe-like surface on the upper flat surface of the ridge waveguide 9.

FIGS. 4(a), 4(c), 4(d), and 4(e) are cross-sectional views and FIG. 4(b) is a perspective view, illustrating a method of fabricating the conventional ridge type semiconductor laser. In these figures, the same reference numerals as shown in FIG. 3 designate the identical or corresponding parts; reference numeral 8 designates an insulating film having a stripe-like surface.

FIG. 5 is a cross-sectional view illustrating a principal process of the method of fabricating the conventional ridge type semiconductor laser. In the figure, the same reference numerals as shown in FIGS. 4(a)–4(e) designate identical or corresponding parts.

A description is given of the method of fabricating the conventional ridge type semiconductor laser.

Initially, on the n-GaAs substrate 1 in a wafer state (the wafer state is not shown), the n-$Al_{0.3}Ga_{0.7}As$ lower cladding layer 2, the quantum well active layer 3, the p-$Al_{0.3}Ga_{0.7}As$ first upper cladding layer 4, the p-$Al_{0.7}Ga_{0.3}As$ etch-stopping layer 5, the p-$Al_{0.3}Ga_{0.7}As$ second upper cladding layer 6, and the p-GaAs contact layer 7 are epitaxially grown in this order. FIG. 4(a) shows a cross-sectional view of the wafer after completing the epitaxial growth.

Thereafter, the wafer is completely covered with an insulating film (not shown) and then coated with a photoresist(not shown) having the desired pattern which is formed by means of photolithographic techniques. Using the photoresist as a mask, the insulating film 8 is selectively etched to a shape like a stripe. $Si_3N_4$, $SiO_2$ or the like is used as the material for the insulating film. The stripe-like insulating film 8 serves as a mask for etching to produce a ridge waveguide. FIG. 4(b) shows a cross-sectional view after the patterning of the insulating film 8.

Thereafter, using the insulating film 8 as a mask, the p-GaAs contact layer 7 and the p-$Al_{0.3}Ga_{0.7}As$ second upper cladding layer 6 are selectively etched, the etching being stopped at the p-$Al_{0.7}Ga_{0.3}As$ etch-stopping layer, to produce a ridge waveguide having a ridge structure extending like a stripe in the desired direction. Examples of a solution for etching are a mixture of tartaric acid and hydrogen peroxide, or a mixture of sulfuric acid, hydrogen peroxide, and water. FIG. 4(c) shows a cross-sectional view after the etching step.

After the etching to produce a ridge structure, the stripe-like insulating film 8 is selectively removed by wet or dry etching. The entire wafer is covered with insulating film 14 again. Further, the photoresist 16 is deposited on the insulating film 14 and, by use of the photolithographic technique, an opening 17 is made in the photoresist on the upper flat surface of the ridge waveguide 9 shown in FIG. 4(e). Using the photoresist 16 as a mask, a portion of the insulating film 14 situated on the upper flat surface of the ridge waveguide 9 is selectively removed by dry etching or the like to form opening 15. Furthermore, the p side electrode 12 is formed on top of the wafer. Thus, the p side electrode 12 comes into contact with the contact layer 7 only through the opening 15. That is, the current is allowed to flow only through the opening 15.

Finally, the n side electrode 13 is formed on the rear surface of the substrate 1. The wafer is cleaved into chips, making facets of laser resonators, thereby completing the semiconductor laser shown in FIG. 3.

A description is given of how the conventional ridge-type semiconductor laser operates.

When voltage is applied across the p side electrode as a plus pole and the n side electrode as a minus pole, holes are injected into the active layer 3 through the p-GaAs contact layer 7, the p-AlGaAs second upper cladding layer 6 and the p-AlGaAs first upper cladding layer 4, while electrons are also injected into the active layer 3 through the n-GaAs substrate 1 and the n-AlGaAs lower cladding layer 2. The recombination of electrons and holes occurs in the active region of the quantum well active layer 3, producing light by the stimulated emission of radiation. Provided that a substantial volume of carriers are injected into the active region to produce light beyond the loss of the ridge waveguide, laser oscillation will occur.

At this time, current can not flow through the other regions except the upper flat surface of the ridge waveguide 9 since those regions are covered with the insulating film 14. Namely, the current is allowed to flow only into the ridge waveguide 9. Thus, the quantum well active layer 3 disposed under the ridge waveguide 9 serves as an active region so as to produce laser oscillation.

A semiconductor laser generally confines light within an active region due to a difference in the refractive indices between an active layer and cladding layers along a direction perpendicular to the surface of a substrate. Therefore, light confinement along a vertical direction is effective along the entire waveguide of the semiconductor laser. As opposed to this, a ridge type semiconductor laser guides light along a direction parallel to the surface of a substrate due to an effective difference in the refractive indices between a ridge waveguide and its adjacent regions. When the width of a ridge is constant, higher modes of oscillation occur more easily, the larger the difference in the refractive indices between the ridge waveguide and its adjacent regions. Conversely, as the difference in the refractive indices decreases, the tolerable width of the ridge without higher modes of oscillation becomes larger. Namely, it is possible for a wider ridge to cut off higher modes. In this case, however, as the volume of the injected current is increased, the refractive index decreases in the middle of the ridge where current density is high. Hence, a slight fluctuation of the current distribution occurs, which causes the phenomenon whereby the spot of light floats. As a result, a non-linear state, the so-called kink, emerges on the light output versus current characteristics in which light output is not proportional to current. A kink means that there will be a serious failure during the actual use of the device.

A solution to this problem is to make the ridge sufficiently narrow so that higher modes of oscillation do not occur. When the width of the ridge is less than 3 μm, the horizontal transverse mode remains as a fundamental mode with good controllability. The thicknesses of the upper and the lower cladding layers both need to be more than 1.5 μm in order to confine light effectively within an active layer in which light generation occurs. In this case, when the width of the lower side of the ridge waveguide 9 is 3 μm, the width of the upper side thereof needs to be less than 1 μm. This results in the upper flat surface of the ridge waveguide 9 becoming so small that it is very difficult to transfer the pattern of an opening thereon in the step of forming the opening 15 of the insulating film 14 on the upper surface of the ridge waveguide 9 in order to make contact with the p side electrode 12. As a result, as shown in FIG. 5, the opening 15 of the insulating film 14 is not correctly positioned on the upper flat surface of the ridge waveguide 9. In this case, the size of the area where the p side electrode 12 is in contact with the p-GaAs contact layer for ohmic contact is effectively reduced, and thus the contact resistance of this area becomes so high that the area may heat and melt during the operation of the device and the operating characteristics will change. A defect could result in the characteristics of the device. When the misposition is so large that the two layers have no contact with each other, it is impossible to fabricate devices and the yield is severely reduced.

Further, when the opening 15 of the insulating film 14 is not correctly positioned on the upper surface of the ridge waveguide 9, the p side electrode 12 does not come into contact with the proper area on the upper surface of the ridge waveguide 9 through which a part of the current flows into the active layer 3. In such a case the current becomes non-uniform and asymmetrical with respect to the ridge waveguide 9. As a result, the current distribution becomes asymmetrical with respect to the ridge waveguide 9, which causes a problem in that the horizontal transverse mode becomes unstable and the level of the light output is lowered because of the occurrence of a kink.

Further, the thermal expansion coefficient of the insulating film is much different from those of semiconductor crystals included in the semiconductor laser. A protruding part like the ridge waveguide 9 is likely to be exposed to stress. Therefore, when the conventional semiconductor laser operates at a high-output, generation of heat during operation causes stress at the junction of the insulating film 14 and semiconductor crystals and crystalline defects are induced at the lower part of the ridge waveguide 9, which reduces the reliability of the semiconductor laser with the passage of time.

Furthermore, the refractive index of 1.5~1.9 of the insulating film 14 is much different from those around 3.4 of semiconductor crystals, such as the first upper cladding layer 4, the second upper cladding layer 6, and so on. Therefore, a difference in the refractive indices between the insulating film 14 and semiconductor crystals causes the distribution of the refractive index to become larger along a horizontal transverse direction, namely, a direction perpendicular to the extending direction of the ridge waveguide 9 and parallel to the surface of the substrate 1, whereby higher modes occur easily. A problem occurs whereby the tolerable width of the ridge for producing a fundamental mode becomes so narrow that it becomes very difficult to construct the ridge.

SUMMARY OF THE INVENTION

It is an object of the present invention to provide a ridge type semiconductor laser, which has correct positioning at the area where the ridge waveguide is in contact with an electrode, which has improved reliability, and which reduces the distribution of effective refractive index along a horizontal transverse direction, and a method of fabricating the ridge type semiconductor laser.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention which achieves the objective, a semiconductor laser comprises of a first conductivity type lower cladding layer, an active layer, a second conductivity type upper cladding layer, a second conductivity type contact layer which are disposed in this order on a first conductivity type semiconductor substrate, and a ridge waveguide in the form of a stripe extending along the desired direction comprising of the upper portion of the upper cladding layer and the contact layer, an oxidized semiconductor material layer including a higher composition ratio of Al than the upper cladding layer and making a lattice match with the substrate, a first electrode which is disposed on the top surface of the substrate containing the upper surface of the ridge waveguide, and a second electrode which is disposed on the rear surface of the substrate. Thus, a semiconductor laser is realized with good characteristics, good stability of a horizontal transverse mode and a good yield rate because mispositioning of the contact area between a p side electrode and a ridge waveguide can be avoided. Further, the semiconductor laser also has a high level of reliability because the thermal expansion coefficient of the insulating film for current confinement is not different from those of semiconductor layers on which the insulating film is disposed. Furthermore, the semiconductor laser also realizes a tolerable width of the ridge for obtaining a fundamental mode as it becomes wider, since the distribution of effective refractive index along a horizontal transverse direction is reduced due to the refractive index of the insulating film for current confinement being not much different from that of the upper cladding layer.

According to a second aspect of the present invention which achieves the objective, in the above-mentioned semiconductor laser, the substrate is made of GaAs; the first conductivity type lower cladding layer is made of first conductivity type AlGaAs; the active layer is a semiconductor material which has lower effective band gap energy thereof than the lower cladding layer; the second conductivity type upper cladding layer is made of AlGaAs which has the same composition ratio as the lower cladding layer; the contact layer is made of GaAs; the oxidized semiconductor material layer is made of an oxide of $Al_xGa_{(1-x)}As$ ($x \leq 1$) which has a higher composition ratio of Al than the upper cladding layer. Thus, a semiconductor laser is realized with good characteristics, good stability of a horizontal transverse mode and a good yield rate. Further, the semiconductor laser is also realized with a tolerable width of the ridge for obtaining a fundamental mode that becomes wider, since the distribution of effective refractive index along a horizontal transverse direction is reduced due to the refractive index of the insulating film for current confinement being not much different from that of the upper cladding layer.

According to a third aspect of the present invention which achieves the objective, in the above-mentioned semiconductor laser, the substrate is made of GaAs; the first conductivity type lower cladding layer is made of first conductivity type AlGaInP; the active layer is a semiconductor material which has lower effective band gap energy thereof than the lower cladding layer; the second conductivity type upper cladding layer is made of AlGaInP which has the same composition ratio as the lower cladding layer; the contact layer is made of GaAs; the oxidized semiconductor material layer is made of an oxide of either AlAs or $(Al_xGa_{(1-x)})_{0.5}In_{0.5}P$ ($x \leq 1$) which has a higher composition ratio of Al than the upper cladding layer. Thus, a semiconductor laser is realized with good characteristics, good stability of a horizontal transverse mode and a good yield rate. Further, the semiconductor laser also realizes a tolerable width of the ridge for obtaining a fundamental mode as it becomes wider, since the distribution of effective refractive index along a horizontal transverse direction is reduced due to the refractive index of the insulating film for current confinement being not much different from that of the upper cladding layer.

According to a fourth aspect of the present invention which achieves the objective, in the above-mentioned semiconductor laser, the substrate is made of InP; the first conductivity type lower cladding layer is made of first conductivity type InP; the active layer is a semiconductor material which has lower effective band gap energy thereof than the lower cladding layer; the second conductivity type upper cladding layer is made of second conductivity type InP; the oxidized semiconductor material layer is made of an oxide of $In_{0.53}Al_{0.47}As$. Thus, a semiconductor laser is realized with good characteristics, good stability of a horizontal transverse mode and a good yield rate. Further, the semiconductor laser is also realized with a tolerable width of the ridge for obtaining a fundamental mode that becomes wider, since the distribution of effective refractive index along a horizontal transverse direction is reduced due to the refractive index of the insulating film for current confinement being not much different from that of the upper cladding layer.

According to a fifth aspect of the present invention which achieves the objective, a method of fabricating the above-mentioned semiconductor laser includes a procedure to grow the first conductivity type lower cladding layer, the active layer, the second conductivity type upper cladding layer and the second conductivity type contact layer in this order on the first conductivity type semiconductor substrate; a procedure to form on the contact layer an insulating film in the form of a stripe extending along the desired direction; a procedure to form the ridge waveguide having a ridge structure along the desired direction as a result of selective etching of the contact layer and the upper cladding layer with the use of the insulating film as a mask; a procedure to grow selectively the semiconductor material with the use of the insulating film as a mask, which contains a higher composition ratio of Al than the upper cladding layer and makes a lattice match with the substrate on the contact layer and the upper cladding layer which has been exposed by the etching described above; a procedure to oxidize the semiconductor material; a procedure to form the first electrode on the exposed upper flat surface of the ridge waveguide after removing the insulating film thereby exposing the upper flat surface of the ridge waveguide; and a procedure to form the second electrode on the rear surface of the substrate. Thus, a semiconductor laser is realized with good characteristics, good stability of a horizontal transverse mode and a good yield rate because mispositioning at the contact area between the p side electrode and the ridge waveguide can be avoided.

According to a sixth aspect of the present invention which achieves the objective, in the above-mentioned method of fabricating the semiconductor laser, the procedure for oxidizing the semiconductor material by wet oxidation method is performed by exposing the semiconductor material layer to an atmosphere of water vapor at high temperature. Thus, a semiconductor laser is realized with good characteristics, good stability of a horizontal transverse mode and a good yield rate.

DETAILED DESCRIPTION OF THE PREFERRED EMBODIMENTS

[Embodiment 1]

Figure 1:
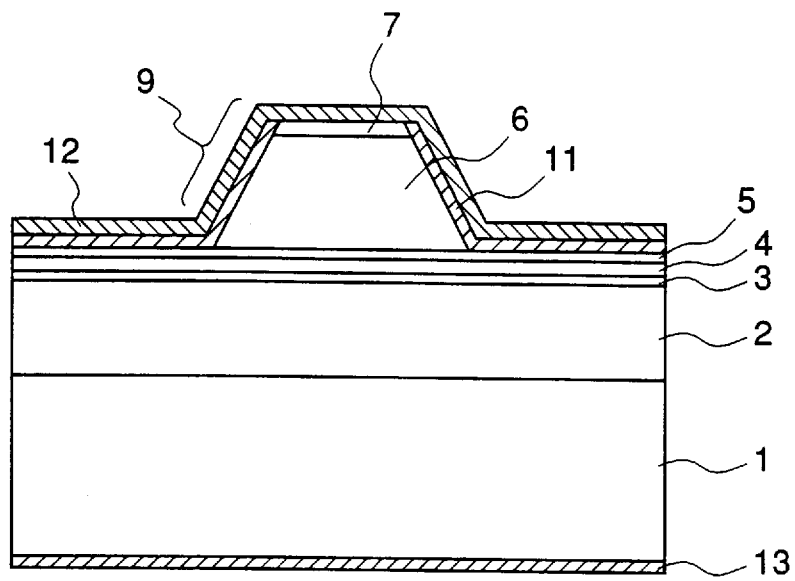
FIG. 1 is a cross-sectional view illustrating a semiconductor laser according to a first embodiment of the present invention.

FIG. 1 illustrates a cross-sectional view of a semiconductor laser taken along a direction perpendicular to the longitudinal direction of the laser resonator, according to the first embodiment of the present invention. In the figure, reference numeral 1 designates an n-GaAs substrate. An n-$Al_{0.3}Ga_{0.7}As$ lower cladding layer 2, a quantum well active layer which is made of AlGaAs, GaAs or the like 3, the quantum well active layer being replaceable by other semiconductor layers if they have a lower effective band gap energy than the lower cladding layer 2, a p-$Al_{0.3}Ga_{0.7}As$ first upper cladding layer 4, a p-$Al_{0.7}Ga_{0.3}As$ etch-stopping layer 5, a p-$Al_{0.3}Ga_{0.7}As$ second upper cladding layer 6, the first and second upper cladding layer functioning as an upper cladding layer, and a p-GaAs contact layer 7 for ohmic contact with a p side electrode described below are laminated in this order on the substrate 1. Ridge waveguide 9 has a ridge structure extending like a stripe which comprises the contact layer 7 and the upper portion of the upper cladding layer, i.e. the second upper cladding layer 6. The AlAs oxide layer 11 is disposed on the ridge waveguide 9 and the etch-stopping layer 5. A p side electrode 12 and an n side electrode 13 are disposed on top and bottom of the laser, respectively.

FIGS. 2(a) to 2(e) are cross-sectional views illustrating a method of fabricating the above-mentioned semiconductor laser, according to a first embodiment of the present invention. In the figures, the same reference numerals as in FIG. 1 designate the identical or corresponding parts; reference numeral 8 designates an insulating film shaped like a stripe and reference numeral 10 designates an AlAs layer 11.

A description is given of the method of fabricating the semiconductor laser according to a first embodiment of the present invention.

Figure 2:
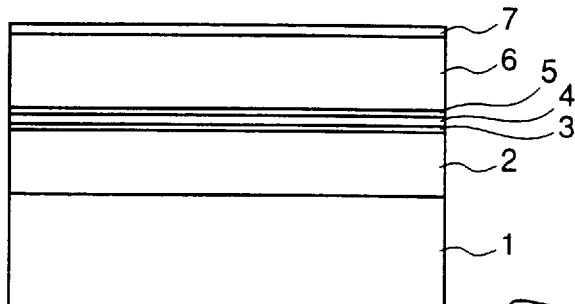
FIGS. 2(a) to 2(e) are cross-sectional views illustrating a method of fabricating a semiconductor laser according to a first embodiment of the present invention.
Figure 2:
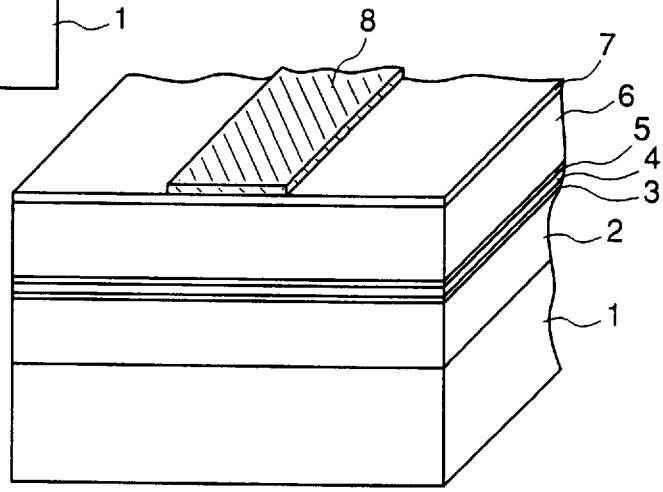
Figure 2:
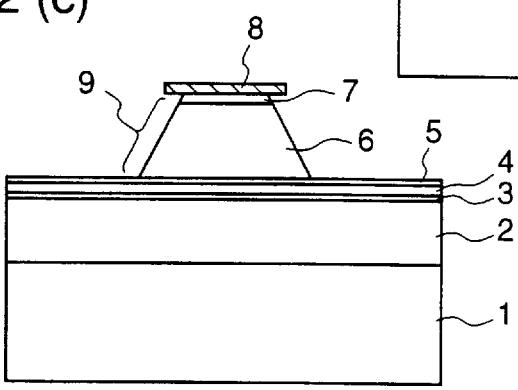
Figure 2:
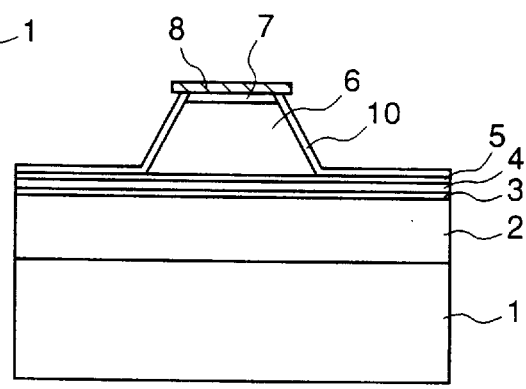
Figure 2:
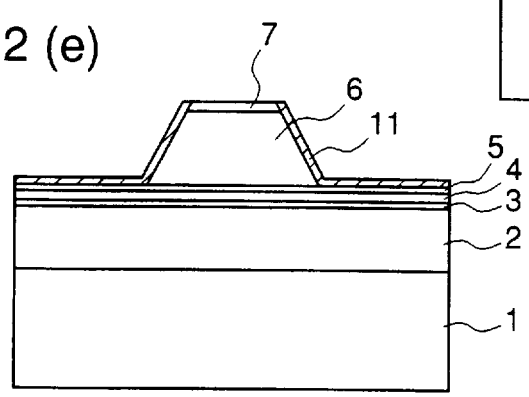
Figure 3:
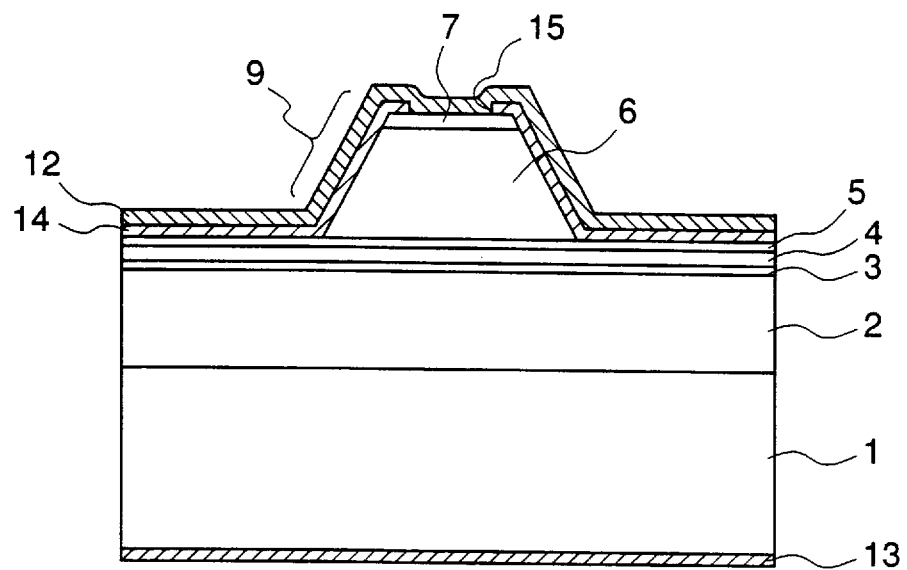
FIG. 3 is a cross-sectional view illustrating a semiconductor laser according to the prior art.
Figure 4:
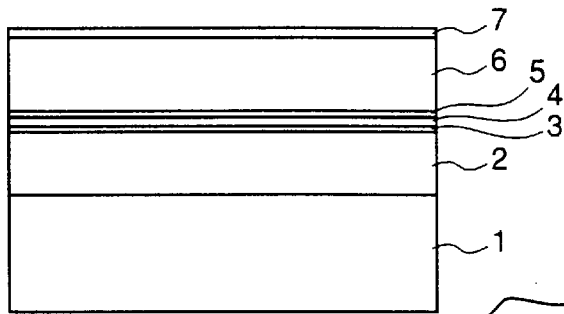
FIGS. 4(a) to 4(e) are cross-sectional views illustrating a method of fabricating a semiconductor laser according to the prior art.
Figure 4:
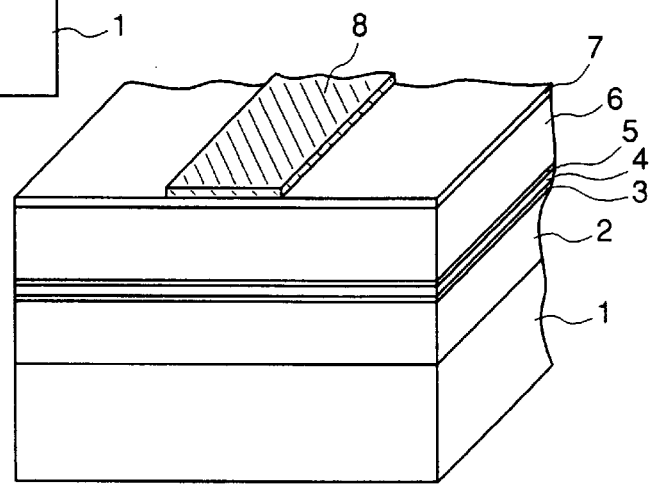
Figure 4:
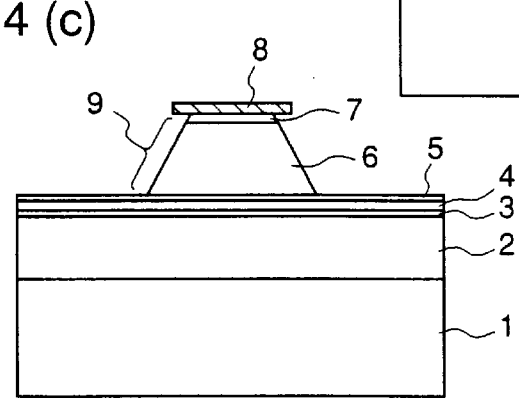
Figure 4:
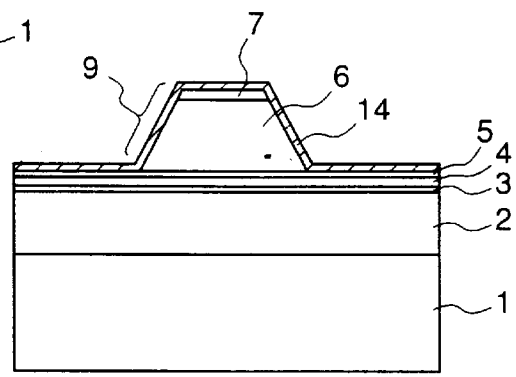
Figure 4:
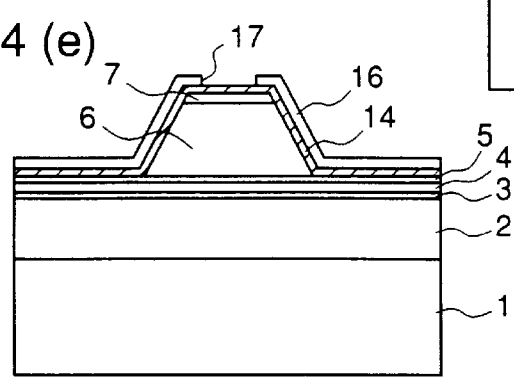
Figure 5:
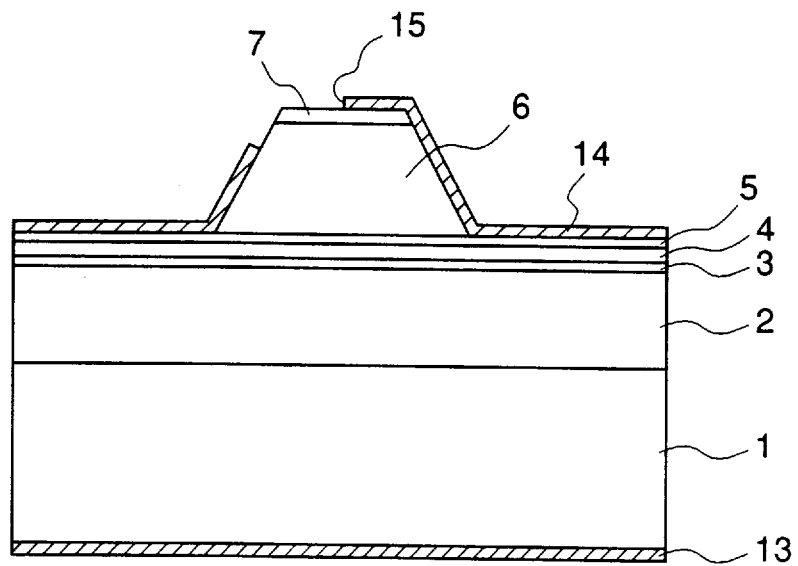
FIG. 5 is a cross-sectional view illustrating the principal step of a method of fabricating a semiconductor laser according to the prior art.

Initially, on the n-GaAs substrate 1 in a wafer state (the wafer state is not shown), as shown in FIG. 2(a), the n-Al$_{0.3}$Ga$_{0.7}$As lower cladding layer 2, the quantum well active layer 3, the p-Al$_{0.3}$Ga$_{0.7}$As first upper cladding layer 4, the p-Al$_{0.7}$Ga$_{0.3}$As etch-stopping layer 5, the p-Al$_{0.7}$Ga$_{0.7}$As second upper cladding layer 6, and the p-GaAs contact layer 7 are successively epitaxially grown by using the metal organic vapor phase epitaxy method or the like. It should be noted that the thickness of the p-Al$_{0.3}$Ga$_{0.7}$As first cladding layer 4 is in the range of 0.05 to 0.5 $\mu$m for stabilizing the horizontal transverse mode.

Thereafter, the wafer is completely covered with an insulating film, and then the stripe-like insulating film 8 is formed by transferring a stripe-like pattern thereon. Si$_3$N$_4$SiO$_2$ or the like is used as the material for the insulating film 8. The stripe-like insulating film 8 serves as a mask for etching to produce a ridge waveguide 9. FIG. 2(b) shows a cross-sectional view of the insulating film 8 after the patterning thereof.

Then, using the insulating film 8 as a mask, a ridge astructure is formed by etching, namely, the p-GaAs contact layer 7 and the p-Al$_{0.3}$Ga$_{0.7}$As second upper cladding layer 6 are selectively etched, the etching being stopped at the p-Al$_{0.7}$Ga$_{0.3}$As etch-stopping layer 5. Examples of a solution for etching are a mixture of tartaric acid and hydrogen peroxide, and a mixture of sulfuric acid, hydrogen peroxide, and water. FIG. 2(c) shows a cross-sectional view after the etching step. It is also possible to form the ridge waveguide 9 even when only one upper cladding layer is prepared in place of the first upper cladding layer 4 and the second upper cladding layer 6 and, without the etch-stopping layer 5, by this means the upper portion thereof is etched.

After the etching that produces the ridge structure, as shown in FIG. 2(d), a second crystal growth is made to form the AlAs layer 10 on the side face of the ridge waveguide 9, the upper surface of the first cladding layer 4 and the upper surface of the etch-stopping layer 5 which have been exposed by the etching. In this case, the stripe-like insulating film 8 serves as a mask for selective growth, leaving parts untouched during the crystal growth step.

Thereafter, the stripe-like insulating film 8 is selectively removed by wet or dry etching in order to expose the upper surface of the contact layer 7 before the AlAs layer 10, as shown in FIG. 2(e), is oxidized. In the oxidation of the AlAs-oxide layer 11 by wet oxidation, a semiconductor layer is exposed to an atmosphere of water vapor at high temperature. How wet oxidation is performed here is described below: the wafer is placed into the chamber of an annealing furnace. Oxidation occurs when water vapor flows into the chamber while keeping the chamber at a temperature in the range of 300° to 650° C. The desired thickness of the AlAs-oxide layer 11 can be obtained by controlling the annealing time since the progress of oxidation of the AlAs layer 10 is proportional to the annealing time to the power of one half. In this case, wet oxidation does not occur on the upper surface of the contact layer 7 because the contact layer 7 is made of GaAs which does not contain Al, making the contact layer 7 more difficult to oxidize than the AlAs layer 10 containing Al. Also, the wet oxidation may be performed before the insulating film 8 is removed. Moreover, the wet oxidation may be substituted for other oxidation methods. For example, oxidation can be carried out in an atmosphere of oxygen.

Thereafter, the p side electrode 12 made of Ti/Pt/Au is formed so as to cover an area on the wafer which contains the upper flat surface of the contact layer 7. The area is possibly the entire wafer. As a result, the p side electrode 12 is in contact only with the GaAs contact layer 7 which is exposed on the upper flat surface of the ridge waveguide 9. Further, the n side electrode 13 made of AuGe/Ni/Ti/Au is formed on the rear surface of the substrate 1. The wafer is cleaved into chips which have facets of laser resonators as shown in FIG. 1, whereby the fabrication process of the semiconductor laser is now completed.

A description is given of how this semiconductor laser operates.

When a voltage is applied across the p side electrode as a plus pole and the n side electrode as a minus pole, holes are injected into the active layer 3 through the p-GaAs contact layer 7, the p-AlGaAs second upper cladding layer 6, and the p-AlGaAs first upper cladding layer 4, and electrons are injected into the active layer 3 through the n-GaAs substrate 1 and the n-AlGaAs lower cladding layer 2. The recombination of electrons and holes occurs in the active region of the quantum well active layer 3, producing light by the stimulated emission of radiation. If a substantial volume of carriers is injected to produce light greater than the loss of the waveguide, laser oscillation will occur.

At this time, the current cannot flow through the other regions except the upper flat surface of the ridge waveguide 9 because those regions are covered with the insulating AlAs oxide layer 11. That is, the AlAs oxide layer 11 serves as an insulating layer for current confinement, and thus the current is allowed to flow only into the ridge waveguide 9. The quantum well active layer 3 positioned under the ridge waveguide 9 becomes an active region so as to produce laser oscillation.

In the semiconductor laser according to the first embodiment, the AlAs oxide layer 11 functions as an insulating layer for current confinement. The ridge waveguide 9 is formed by an etching with the use of the stripe-like insulating film 8. The AlAs layer 10 is selectively grown on the surface of the substrate 1 except for the upper flat surface of the ridge waveguide 9, and then the AlAs layer 10 is oxidized to form the AlAs oxide layer 11. Therefore, the AlAs oxide layer 11 is not formed at all on the upper flat surface of the ridge waveguide 9. The AlAs oxide layer 11 is formed only on the other regions of the upper side, and not on the upper flat surface of ridge waveguide 9.

As a result, the p side electrode 12 formed on the surface of the wafer is in contact only with the contact layer 7 which is only on the upper flat surface of the ridge waveguide 9 and is not covered by the AlAs oxide layer 11.

Therefore, this semiconductor laser does not have the problem as described above in the BACKGROUND of the INVENTION section. The problem was that in a conventional semiconductor laser an opening must be formed for an n side electrode make contact with the contact layer on the upper flat surface of the ridge waveguide. The opening is formed by removing a portion of the insulating film situated on the upper flat surface of the ridge after the entire upper surface of a substrate containing the upper flat surface of the ridge is covered with insulating film. When the width of the ridge waveguide becomes narrower, incorrect positioning of the opening occurs and the electrode does not make contact with the ridge waveguide in the proper position, which causes a problem whereby the effective contact area between the electrode and the contact layer is reduced.

The semiconductor laser of the first embodiment realizes an effective contact area between the contact layer 7 and the p side electrode 12 which is always constant as a result of the contact layer 7 making contact with the p side electrode 12 on the upper flat surface of the ridge waveguide 9.

Further, as the p side electrode 12 is in contact with the upper surface of the ridge waveguide 9, the current flows from the upper part of the ridge waveguide 9, symmetrically with respect to the ridge waveguide 9. As a result, the current distribution is symmetrical with respect to the ridge waveguide 9, which eliminates the problem described in the BACKGROUND of the INVENTION section of the horizontal transverse mode becoming unstable and the level of the light output being reduced when a kink occurs.

In this semiconductor laser, as in the first embodiment of the present invention, current confinement is performed by the AlAs oxide layer 11 which is of the same family of materials as the other semiconductor layers used in the semiconductor laser. The AlAs oxide layer 11 has almost the same thermal expansion coefficient as the other semiconductor layers adjacent thereto. This is a solution to the problem described in the BACKGROUND of the INVENTION section in which stresses from the insulating film during operation cause crystalline defects to occur within the semiconductor laser because the thermal expansion coefficient of the insulating film for current confinement is much different from those of the semiconductor layers, resulting in an undesired reduction in reliability.

Furthermore, since the AlAs oxide layer 11 is made of almost the same semiconductor material as those of the first upper cladding layer 4 and the second upper cladding layer 6, their refractive indices are almost the same. This causes a reduction the distribution of the effective refractive index of the ridge waveguide 9 along the horizontal transverse direction so that the tolerable width of the ridge for obtaining a fundamental mode may to be wider. This result is not achieved by the conventional semiconductor laser utilizing an insulating film for current confinement described in the BACKGROUND of the INVENTION section wherein the refractive index of the insulating film is much different from that of the upper cladding layer.

As described above, according to the first embodiment of the present invention, a lower cladding layer 2, an active layer 3, a first upper cladding layer 4, an etch-stopping layer 5, a second upper cladding layer 6 and a contact layer 7 are formed on a substrate 1. Thereafter, using a stripe-like insulating film 8 as a mask, the second upper cladding layer 6 and the contact layer 7 are selectively etched to form a ridge waveguide 9. Using the insulating film 8 as a mask an AlAs layer 10 is selectively grown on the surface of the substrate 1. An AlAs oxide layer 11 is formed by wet-oxidizing the AlAs layer 10. Finally, a p side electrode 12 is formed on the surface of the substrate 1. Consequently, incorrect positioning of the contact area between a p side electrode and a ridge waveguide can be avoided, resulting in a semiconductor laser with good characteristics, a good yield rate, and good stability of a horizontal transverse mode.

Further, a semiconductor laser with good reliability is realized because the thermal expansion coefficient of the insulating film for current confinement is not different from those of semiconductor layers on which the insulating film is disposed.

Furthermore, a semiconductor laser is realized wherein the tolerable width of the ridge for obtaining a fundamental mode of oscillation becomes wider, since the distribution of effective refractive index along a horizontal transverse direction is reduced owing to the refractive index of the insulating film for current confinement being not much different from that of the upper cladding layer.

In the first embodiment of the present invention, emphasis has been placed upon semiconductor lasers including an AlAs oxide layer as an insulating layer for current confinement. However, a semiconductor laser including a semiconductor layer which makes a lattice match with a substrate and contains a higher composition ratio of Al than at least the upper cladding layer is within the scope of the invention. For example, AlAs can be substituted for some semiconductors which have an insulating property upon oxidation. In the first embodiment, the AlAs layer 10 can be substituted for an $Al_xGa_{(1-x)}As(x \leq 1)$ layer, provided that it includes higher composition ratio of Al than the upper cladding layer 4. In this case, the composition ratio x of Al is preferred to be more than 0.8 so the $Al_xGa_{(1-x)}As$ $(x \leq 1)$ is sufficiently oxidized.

[Embodiment 2]

Figure 6:
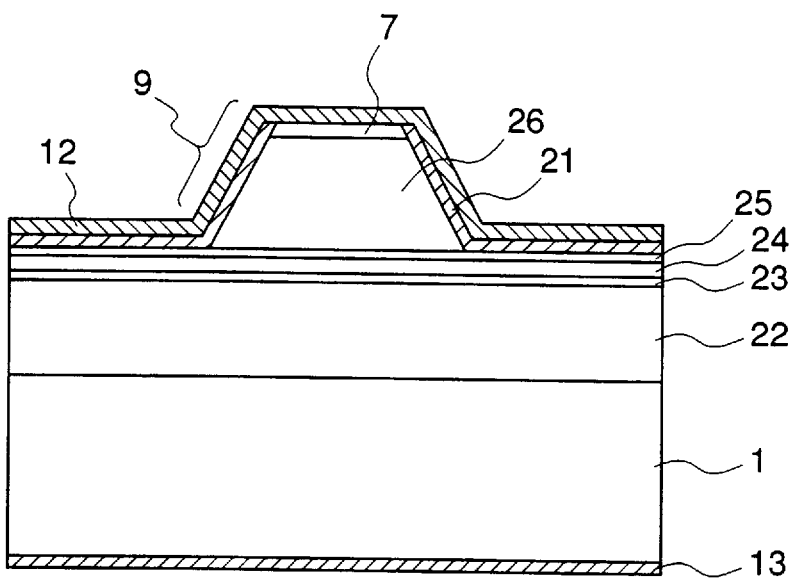
FIG. 6 is a cross-sectional view illustrating a semiconductor laser according to a second embodiment of the present invention.

FIG. 6 illustrates a cross-sectional view of a semiconductor laser, taken along a direction perpendicular to the longitudinal direction of the laser resonator, according to the second embodiment of the present invention. In the figure, the same reference numerals as those shown in FIG. 1 designate the identical or corresponding parts. The laser includes an n-$(Al_{0.7}Ga_{0.3})_{0.5}In_{0.5}P$ lower cladding layer 22, an AlGaInp/InGaP quantum well active layer 23, a p-$(Al_{0.7}Ga_{0.3})_{0.5}In_{0.5}P$ first upper cladding layer 24, a p-$In_{0.5}Ga_{0.5}P$ etch-stopping layer 25, a p-$(Al_{0.7}Ga_{0.3})_{0.5}In_{0.5}P$ second upper cladding layer 26, and an AlAs oxide layer 21 laminated in this order on a substrate 1. An $Al_{0.5}In_{0.5}P$ oxide layer can be substituted for the AlAs oxide layer 21.

In the semiconductor laser according to the second embodiment, semiconductor layers formed on the GaAs substrate 1 are made of an AlGaInP family of materials in place of materials used in the semiconductor laser in the first embodiment. That is, the material for lower cladding layer 22 is n-$(Al_{0.7}Ga_{0.3})_{0.5}In_{0.5}P$, the active layer 23 employs either a single semiconductor layer which makes a lattice match with the substrate 1 and has a lower band gap energy than the lower cladding layer 22, such as an AlgainP/InGaP quantum well structure or a quantum well layer, and a first upper cladding layer 24 and a second upper cladding layer 26, both employing p-$(Al_{0.7}Ga_{0.3})_{0.5}In_{0.5}P$ layers. An insulating semiconductor layer for current confinement employs an AlAs oxide layer 21 or a semiconductor oxide layer which makes a lattice match with the substrate 1 and has a higher composition ratio of Al than the first upper cladding layer 24 and the second upper cladding layer 26, for example, an $(Al_xGa_{(1-x)})_{0.5}In_{0.5}P(x \leq 1)$ oxide layer. This semiconductor laser is formed by almost the same fabrication process as the semiconductor laser in the first embodiment. In particular, the AlAs oxide layer 21 or the $Al_{0.5}In_{0.5}P$ oxide layer is grown on top of the substrate 1 with the use of an insulating film as a mask which had been used for forming the ridge waveguide, as each is either an AlAs layer or an $Al_{0.5}In_{0.5}P$ layer, respectively, at the time, and the form is completed by the oxidation method described above for the first embodiment.

In this semiconductor laser according to the second embodiment, incorrect positioning at the contact area between a p side electrode 12 and a ridge waveguide 9 is avoided, the coefficient of thermal expansion of the insulating layer 21 for current confinement is not different from those of its adjacent layers and the difference in the refractive indices between the insulating layer 21 for current confinement and the first upper cladding layer 24 or the second upper cladding layer 26 is reduced. Thus, the semiconductor laser in the second embodiment is within the scope of the invention.

[Embodiment 3]

Figure 7:
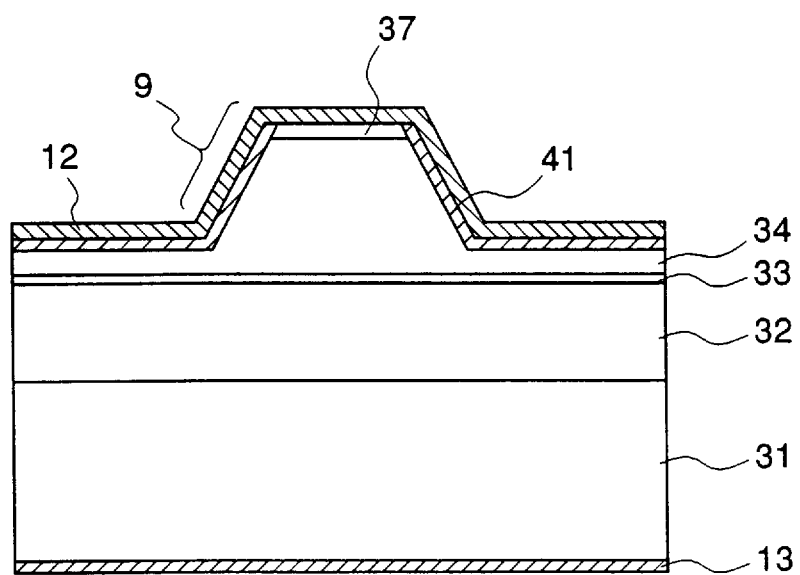
FIG. 7 is a cross-sectional view illustrating a semiconductor laser according to a third embodiment of the present invention.

FIG. 7 illustrates a cross-sectional view of a semiconductor laser, taken along a direction perpendicular to the longitudinal direction of the laser resonator, according to the third embodiment of the present invention. In the figure, the same reference numerals as those shown in FIG. 1 designate the identical or corresponding parts. The laser includes an n-InP substrate 31. An n-InP lower cladding layer 32, an InGaAsP quantum well active layer 33, a p-InP upper cladding layer 34, a p-In$_{0.53}$Ga$_{0.47}$As contact layer 37 for ohmic contact with a p side electrode 12 which can be replaced by a p-InP layer, and an In$_{0.53}$Al$_{0.47}$As oxide layer 41 are laminated on the substrate 31.

This semiconductor laser according to the third embodiment is the same as the semiconductor laser in the first embodiment except that the former is made of materials from the InP family and the substrate of the former is an InP substrate 31 in place of a GaAs substrate 1 of the latter. That is, the material for the lower cladding layer 22 is n-InP, the active layer 33 employs either a semiconductor layer which makes a lattice match with the substrate and has a lower band gap energy than the lower cladding layer, like an InGaAsP quantum well structure or a quantum well layer, and the upper cladding layer 34 employs a single InP layer corresponding to a combination of the first and the second upper cladding layers. An insulating semiconductor layer for current confinement 41 employs a semiconductor oxide layer which makes a lattice match with the substrate and has a higher composition ratio of Al than the cladding layer, for example, an In$_{0.53}$Al$_{0.47}$As oxide layer or the like. This semiconductor laser is formed by almost the same fabrication process as the semiconductor laser in the first embodiment. In particular, the In$_{0.53}$Al$_{0.47}$As oxide layer 41 is grown on top of the substrate 1 with the use of an insulating film as a mask which had been used for forming the ridge waveguide, as it is yet an In$_{0.53}$Al$_{0.47}$As layer at the time. The form is completed by the oxidation described above in the first embodiment.

In this semiconductor laser according to the third embodiment, incorrect positioning at a contact area where the p side electrode 12 meets the ridge waveguide 9 is avoided, the thermal expansion coefficient of the insulating layer 41 for current confinement is not different from those of its adjacent layers and a difference in the refractive indices between the insulating layer 41 for current confinement and the upper cladding layer 34 is reduced. Thus, the semiconductor laser in the third embodiment is within the scope of the invention.

In the first, second, and third, embodiments of the invention, emphasis has been placed upon semiconductor lasers including an n Type substrate. However, a p Type semiconductor laser including a substrate, and reversed conductivity type from semiconductor layers the described embodiments, is within the scope of the invention.

What is claimed is:

1. A semiconductor laser comprising:

a first conductivity type semiconductor substrate having front and rear surfaces;

a first conductivity type lower cladding layer, an active layer, a second conductivity type upper cladding layer, and a second conductivity type contact layer disposed in this order on the first conductivity type semiconductor substrate, a ridge waveguide in the form of a stripe extending along a desired direction, having an upper planar surface, and comprising an upper portion of said upper cladding layer and said contact layer, an oxidized semiconductor material layer including a larger composition ratio of Al than said upper cladding layer and making a lattice match with said substrate, disposed on said substrate except for the upper planar surface of said ridge waveguide, a first electrode disposed on said upper planar surface of said ridge waveguide, and a second electrode disposed on the rear surface of said substrate.

2. The semiconductor laser of claim 1 wherein:

said substrate is GaAs;

said first conductivity type lower cladding layer is first conductivity type AlGaAs;

said active layer is a semiconductor material having a lower effective band gap energy than said lower cladding layer;

said second conductivity type upper cladding layer is AlGaAs having the same Al composition ratio as said lower cladding layer;

said contact layer is GaAs; and said oxidized semiconductor material layer is an oxide of Al$_x$Ga$_{(1-x)}$As (x≦1) having a higher composition ratio of Al than said upper cladding layer.

3. The semiconductor laser of claim 1 wherein:

said substrate is GaAs;

said first conductivity type lower cladding layer is first conductivity type AlGaInP;

said active layer is a semiconductor material having a lower effective band gap energy than said lower cladding layer;

said second conductivity type upper cladding layer is AlGaInP having the same composition ratio as said lower cladding layer;

said contact layer is GaAs; and said oxidized semiconductor material layer is one of AlAs and an oxide of (Al$_x$Ga$_{(1-x)}$)$_{0.5}$In$_{0.5}$P (X≦1) having a higher composition ratio of Al than said upper cladding layer.

4. The semiconductor laser of claim 1 wherein:

said substrate is InP;

said first conductivity type lower cladding layer is first conductivity type InP;

said active layer is made of a semiconductor material having a lower effective band gap energy than said lower cladding layer;

said second conductivity type upper cladding layer is second conductivity type InP; and said oxidized semiconductor material layer is an oxide of In$_{0.53}$Al$_{0.47}$As.

* * * * *